United States Patent
Hori et al.

(10) Patent No.: US 8,961,888 B2
(45) Date of Patent: Feb. 24, 2015

(54) PLASMA GENERATOR

(75) Inventors: Masaru Hori, Aichi (JP); Hioryuki Kano, Aichi (JP)

(73) Assignees: Masaru Hori, Nagoya-Shi, Aichi (JP); Nu Eco Engineering Co., Ltd., Nishikamo-Gun, Aichi (JP)

( * ) Notice: Subject to any disclaimer, the term of this patent is extended or adjusted under 35 U.S.C. 154(b) by 0 days.

(21) Appl. No.: 12/733,896

(22) PCT Filed: Sep. 18, 2008

(86) PCT No.: PCT/JP2008/066813
§ 371 (c)(1),
(2), (4) Date: Aug. 3, 2010

(87) PCT Pub. No.: WO2009/041334
PCT Pub. Date: Apr. 2, 2009

(65) Prior Publication Data
US 2010/0296979 A1    Nov. 25, 2010

(30) Foreign Application Priority Data
Sep. 28, 2007    (JP) ................... 2007-255314

(51) Int. Cl.
*B01J 19/08*    (2006.01)
*H05H 1/24*    (2006.01)
*H01J 37/32*    (2006.01)

(52) U.S. Cl.
CPC .............. *H05H 1/24* (2013.01); *H01J 37/3244* (2013.01); *H01J 37/32449* (2013.01); *H01J 37/32834* (2013.01)
USPC .................. 422/186; 422/186.03; 422/186.04; 204/164

(58) Field of Classification Search
CPC ............ H01J 37/3244; H01J 37/32834; H01J 37/32449; H05H 1/24
USPC ................. 422/186, 186.03, 186.04; 204/164
See application file for complete search history.

(56) References Cited

U.S. PATENT DOCUMENTS

| 5,883,470 A | 3/1999 | Hatakeyama et al. |
| 7,098,420 B2 | 8/2006 | Crowe et al. |

(Continued)

FOREIGN PATENT DOCUMENTS

| CN | 1540033 A | 10/2004 |
| JP | 3-75371 A | 3/1991 |

(Continued)

OTHER PUBLICATIONS

Japanese Office Action dated May 8, 2012 with partial English translation.

(Continued)

*Primary Examiner* — Xiuyu Tai
(74) *Attorney, Agent, or Firm* — McGinn IP Law Group, PLLC

(57) ABSTRACT

To provide a plasma generator having plasma-generating zone of increased volume.
A plasma generator 110 has a cylindrical casing 11 made of a sintered ceramic produced from alumina ($Al_2O_3$) as a raw material. The casing 11 has a slit-like gas inlet 11*i* and a plurality of cylindrical gas outlets 11*o*. From the gas inlet 11*i* to the top of the plasma-generating zone P, the slit width (the front-to-back direction with respect to the sheet of FIG. 2.A, and the left-to right direction in FIG. 2.B) is adjusted to 1 mm, and gas outlets 11*o* each having an inner diameter of 1 to 2 mm are formed in straight line along the longitudinal direction of the plasma-generating zone P. The plasma-generating zone P has a square cross-section normal to the longitudinal direction having a side of 2 to 5 mm. Each of the surfaces of the electrodes 2*a*, 2*b* facing each other has a plurality of recesses (hollow portions). An elevated voltage of about 9 kV obtained from a commercial AC voltage (60 Hz, 100 V) was applied to the electrodes 2*a*, 2*b*, to thereby supply a current of 20 mA. When argon gas was supplied through the gas inlet 11*i*, even in the case where the electrodes 2*a*, 2*b* were separated at a spacing of 4 cm, stable linear electric discharge was observed.

20 Claims, 1 Drawing Sheet

(56) References Cited

U.S. PATENT DOCUMENTS

| | | |
|---|---|---|
| 7,217,326 B2 | 5/2007 | Lee |
| 2002/0008480 A1* | 1/2002 | Yamazaki et al. ........ 315/111.21 |
| 2002/0187066 A1* | 12/2002 | Yu et al. ........................ 422/22 |
| 2002/0192370 A1 | 12/2002 | Metzner et al. |
| 2003/0052096 A1 | 3/2003 | Crowe et al. |
| 2004/0200413 A1 | 10/2004 | Lee |
| 2005/0016456 A1 | 1/2005 | Taguchi et al. |
| 2006/0042545 A1* | 3/2006 | Shibata et al. ................ 118/722 |
| 2006/0156983 A1* | 7/2006 | Penelon et al. ........... 118/723 E |
| 2006/0185594 A1 | 8/2006 | Uehara et al. |
| 2007/0166207 A1* | 7/2007 | Vauge ....................... 422/186.04 |
| 2008/0050291 A1 | 2/2008 | Nagasawa |

FOREIGN PATENT DOCUMENTS

| | | |
|---|---|---|
| JP | 10-36971 A | 2/1998 |
| JP | 2001-190948 A | 7/2001 |
| JP | 2002-368389 A | 12/2002 |
| JP | 2003-027210 A | 1/2003 |
| JP | 2003-109799 A | 4/2003 |
| JP | 2003-187998 A | 7/2003 |
| JP | 2004-6211 A | 1/2004 |
| JP | 2004-535041 A | 11/2004 |
| JP | 2005-30254 A | 2/2005 |
| JP | 2005-129493 A | 5/2005 |
| JP | 2006-114450 A | 4/2006 |
| JP | 2006-196210 A | 7/2006 |
| JP | 2006-272039 A | 10/2006 |
| JP | 2006-277953 A | 10/2006 |
| JP | 2006-302624 A | 11/2006 |
| JP | 2006-302652 A | 11/2006 |
| JP | 2006-302653 A | 11/2006 |
| WO | WO 2006/096716 A2 | 9/2006 |
| WO | WO 2007/020729 A1 | 2/2007 |

OTHER PUBLICATIONS

Japanese Office Action dated Jul. 1, 2008 with partial English translation.
Japanese Office Action dated Oct. 14, 2008 with partial English translation.
Chinese Office Action dated May 30, 2013 with English translation thereof.
Chinese Office Action dated Sep. 28, 2012 with English translation.
US Office Action dated Jan. 9, 2014 in U.S. Appl. No. 12/735,807.
United States Office Action dated Aug. 6, 2014 in Co-Pending U.S. Appl. No. 12/735,807.

* cited by examiner

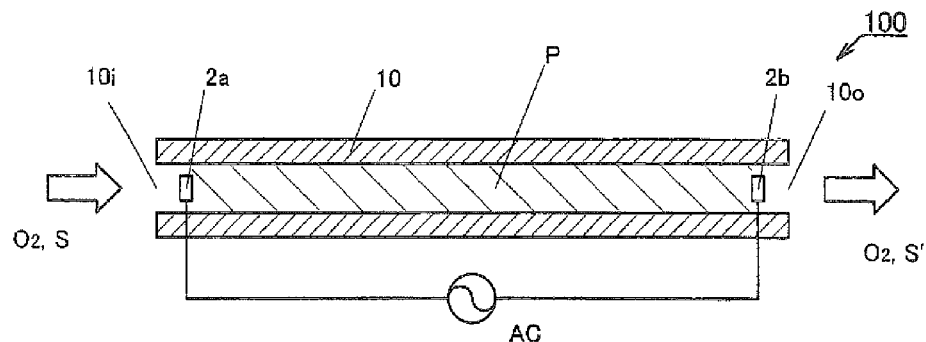
Fig. 1.A
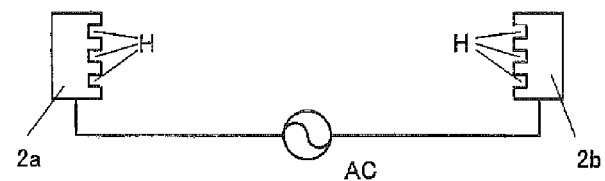
Fig. 1.B
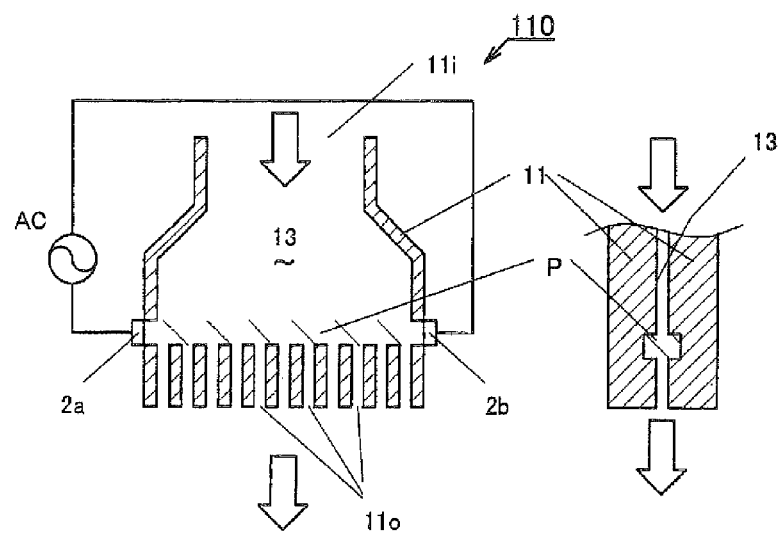
Fig. 2.A
Fig. 2.B

PLASMA GENERATOR

This application is a 371 of PCT International Application No. PCT/JP2008/066813, filed on Sep. 18, 2008.

TECHNICAL FIELD

The present invention relates to a plasma generator and, more particularly, to a so-called atmospheric plasma generator.

BACKGROUND ART

The present inventors previously developed atmospheric plasma generators and filed patent applications therefor (see Patent Documents 1 and 2). In the plasma generators, electrode surfaces facing each other are provided with microscale recesses, to thereby induce hollow cathode electric discharge, through which a plasma is generated. When a plasma-generating gas is caused to pass through the plasma-generating zone, a gas containing at least a plasma can be jetted. Through employment of such a plasma generator, high-density plasma can be readily generated under atmospheric pressure with high-frequency voltage of about some kilovolts obtained from a single-phase commercial power source (100 V) by means of a voltage booster.

Patent Document 1: Japanese Patent Application Laid-Open (kokai) No. 2006-196210
Patent Document 2: Japanese Patent Application Laid-Open (kokai) No. 2006-272039

DISCLOSURE OF THE INVENTION

Problems to be Solved by the Invention

According to the techniques disclosed in Patent Documents 1 and 2, when the inter-electrode distance is short, electric discharge is unstable, whereas when the distance is 1 cm or longer, electric discharge cannot be maintained. Thus, according to Patent Documents 1 and 2, in the case where the plasma-generating zone is, for example, a longitudinally elongated zone, electrodes having a certain width and extending in the longitudinal direction are employed. However, when such wide electrodes are provided to face each other, uniformity in density of the generated plasma is problematically impaired. Specifically, electric discharge cannot be uniformly generated in the relevant electrode surfaces, and electric discharge starting spots are formed on the electrode surfaces. The electric discharge starting spots cause varied and unstable electric discharge, which is problematic. Due to unstable electric discharge, the plasma generators cannot be effectively employed for the plasma treatment of a considerable wide area of an object such as a surface portion of a liquid-crystal panel or the like. In addition, difficulty is encountered in increasing the volume of the plasma-generating zone. Therefore, limitations are imposed on the effective uses of the aforementioned plasma generators, although the plasma generators can generate high-density plasma under atmospheric pressure.

The present invention has been conceived in order to solve the aforementioned problem, and an object of the invention is to provide an atmospheric plasma generator having a plasma-generating zone of increased volume.

Means for Solving the Problems

In a first aspect of the present invention, there is provided an atmospheric plasma generator comprising:

a casing which is made of an insulator and which defines a longitudinal columnar plasma-generating zone;

a pair of electrodes disposed in the plasma-generating zone defined by the casing with a spacing in the longitudinal direction of the plasma-generating zone;

a plasma-generating gas inlet for supplying a plasma-generating gas to the plasma-generating zone in a direction normal to the longitudinal direction of the plasma-generating zone; and outlets for jetting a gas containing at least plasma in a direction normal to the longitudinal direction of the plasma-generating zone, which outlets are provided along the longitudinal direction of the plasma-generating zone.

In a second aspect of the present invention, there is provided an atmospheric plasma generator comprising:

a casing which is made of an insulator and which defines a longitudinal columnar plasma-generating zone;

a pair of electrodes disposed in the plasma-generating zone defined by the casing with a spacing in the longitudinal direction of the plasma-generating zone;

a plasma-generating gas inlet for supplying a plasma-generating gas flow to the plasma-generating zone in the longitudinal direction of the plasma-generating zone, which inlet is provided at one end of the casing; and an outlet for jetting a gas containing at least plasma in the longitudinal direction of the plasma-generating zone, which outlet is provided at the other end of the casing.

In a third aspect of the present invention, a plurality of jetting outlets are provided along the longitudinal direction of the plasma-generating zone.

In a fourth aspect of the invention, the plasma-generating zone has a longitudinal length of 1 cm to 50 cm and a cross-sectional area in a direction normal to the longitudinal direction of 3 mm$^2$ to 25 mm$^2$.

In a fifth aspect of the present invention, the plasma-generating zone has a width normal to the longitudinal direction of the plasma-generating zone and to the gas flow direction of 2 mm to 5 mm.

In a sixth aspect of the present invention, the inside of the casing is not subjected to substantial pressure elevation or reduction so as to serve as an atmospheric plasma source. In the present invention, the term "atmospheric plasma" refers to "plasma generated at 0.5 atm to 2 atm.

In a seventh aspect of the present invention, said pair of electrodes are disposed with a spacing of 1 cm to 50 cm.

In an eighth aspect of the present invention, at least one electrode of said pair of electrodes is provided with hollow portions on a surface thereof which face the other electrode.

In a ninth aspect of the present invention, the longitudinal length L (cm) of the columnar plasma-generating zone and the cross-sectional area σ (mm$^2$) normal to the longitudinal direction satisfy the following relationships: $2 \leq L\sigma \leq 200$ and $3 \leq \sigma \leq 25$.

EFFECTS OF THE INVENTION

In the present invention, an atmospheric plasma is generated in the space defined (or surrounded) by the casing made of an insulator. In the columnar space defined (or surrounded) by the insulator casing, an elongated plasma zone is realized. In the present invention, a conceivable role of the insulator is that the inner surfaces of the casing are electrically charged, to thereby stabilize plasma generation occurring in the entire plasma-generating zone extending in the longitudinal direction and having a large volume. With such a configuration, electric discharge of linear pattern (hereinafter referred to as "linear electric discharge") is consistently obtained in the longitudinal direction. According to the first aspect of the invention, an electric discharge gas is supplied in a direction normal to the linear electric discharge, to thereby generate a plasma flow having a width equivalent to the longitudinal length of the plasma-generating zone. Thus, a wide linear plasma flow can be realized. Through moving the plasma generator relative to an object to be treated (hereinafter referred to as a treatment object) in a direction normal to the longitudinal direction of the plasma-generating zone and to the gas flow direction, the treatment object can be plasma-treated over a wide area.

According to the second aspect of the invention, the plasma-generating gas flows along the longitudinal direction of the plasma-generating zone. In this case, when the treatment object is a gas, the treatment object gas and a plasma-generating gas are mixed, and the gas mixture is supplied through the inlet to the plasma-generating zone. The treated gas can be output through the outlets. Since spot-like plasma beams can be output through the outlets, the treatment object can be micro-processed.

Through employment of hollow cathode electric discharge by the electrode having recessed surfaces described in Patent Document 1 or 2, atmospheric plasma can be readily generated.

The columnar plasma-generating zone of the present invention has a longitudinal length L (cm) of 1 to 50 and a cross-sectional area $\sigma$ ($mm^2$) normal to the longitudinal direction of 3 to 25. For a smaller cross-sectional area $\sigma$, a longer length L of the columnar plasma-generating zone can be realized.

When the width, of the plasma-generating zone, normal to the longitudinal direction and to the gas flow direction is adjusted to 2 mm to 5 mm, linear plasma can be consistently generated in the longitudinal direction of the plasma-generating zone.

When the casing is substantially cylindrical, the length L can be increased. Experiments have confirmed that plasma can be consistently generated when an L-$\sigma$ relationship of $2 \leq L\sigma \leq 200$ is satisfied.

BRIEF DESCRIPTION OF THE DRAWINGS

FIG. 1.A is a cross-section of a plasma generator 100 according to one embodiment of the present invention. FIG. 1.B shows the detailed shapes of electrodes 2a, 2b.

FIG. 2.A is a cross-section of a plasma generator 110 according to another embodiment of the present invention. FIG. 2.B is a cross-section (partial view) of a plasma-generating zone P normal to the longitudinal direction.

DESCRIPTION OF REFERENCE NUMERALS

100, 110: Plasma generator
10, 11: Casing
10i, 11i: Gas inlet
10o, 11o: Gas outlet
2a, 2b: A pair of electrodes facing each other, each facing electrode having hollow portions
P: Plasma-generating zone
H: Hollow portion provided on the facing surfaces of a pair of electrodes 2a, 2b

BEST MODES FOR CARRYING OUT THE INVENTION

The casing must be made from a material which has high resistance to plasma generated in the inside thereof. For example, a ceramic material such as sintered boron nitride (PBN) is preferred.

The electrodes may be formed from stainless steel, molybdenum, tantalum, nickel, copper, tungsten, or an alloy thereof. The electrode surface in which hollow portions for providing hollow cathode electric discharge are provided preferably has a thickness of about 1 to about 30 mm. When the surface has a sufficient thickness, hollow portions can be formed to have different depths, to thereby enhance gas flow rate and density of the generated plasma. A hollow portion for providing hollow cathode electric discharge preferably has a depth of, for example, about 0.5 mm. The hollow portions may be formed non-continuously (i.e., dot-like) or continuously (i.e., groove-like). However, continuous hollow portions are preferred. The shape of the hollow portions may be selected as desired from, for example, columnar, semi-spherical, prismatic, pyramidal, etc.

Examples of the gas which may be used at atmospheric pressure for generating plasma include air, oxygen, rare gas (He, Ne, Ar, etc.), nitrogen, and hydrogen. By use of air or oxygen, active oxygen radicals are formed, and organic contaminants can be effectively removed. Use of air is advantageous in view of economy. In the case where Ar gas (rare gas) is used, oxygen molecules co-existing with Ar plasma during irradiation of a treatment object with the Ar plasma form oxygen radicals. By the mediation of oxygen radicals, organic contaminants present in the surface of the treatment object can be effectively removed. This process is economical because a sole gas of Ar is used. For the aforementioned reasons, a mixture of air and Ar may also be used. The flow rate and supply amount of the gas and the degree of vacuum may be selected as desired. In the present invention, plasma is not generated by high-frequency voltage. The power source connected to each electrode may be a DC power source, an AC power source, or another power source, and no particular limitation is imposed on the frequency.

When a plasma gas is jetted through the outlets to a treatment object, the distance between each jetting outlet and the treatment object, which depends on the gas flow rate, is preferably, for example, 2 mm to 20 mm, more preferably 3 mm to 12 mm, most preferably 4 mm to 8 mm. When oxygen radicals are generated, the distance between each jetting outlet and the treatment object is preferably adjusted so that, on the surface of the treatment object, the oxygen radical density is maximized and the electron density is minimized. Through employment of the above conditions, charge-up damage of the treatment object can be prevented, and the treatment object can be cleaned in the most effective manner. Alternatively, the treatment object may be irradiated with plasma in a direction slanted from the gas flow direction. Through plasma irradiation in this manner, impairment of products caused by irradiation of polarized film, a liquid crystal-sealant, etc. with plasma can be prevented. Onto an area where plasma irradiation should be avoided, a gas such as plasma-free air may be sprayed, so as to prevent diffusion of plasma.

Oxidation of the electrodes is preferably prevented through reducing the oxygen concentration by use of a gas containing nitrogen, Ar, or hydrogen (reducing gas). Alternatively, a plurality of plasmas may be generated so as to remove organic contaminants and prevent reaction with the remaining area. Also, a gas generated from the portion of the treatment object irradiated with plasma after reaction is preferably removed via suction. Through removal of the gas, deposition of the molecules which have been reacted with organic contaminants on remaining area of the treatment object can be prevented. The temperature and density of the plasma, which are measured through, for example, laser beam absorption spectrometry, are preferably adjusted to predetermined levels through feed-back-controlling of applied voltage, duty ratio (in the case of pulse voltage application), irradiation time, gas flow rate, etc. Through the control, high-quality cleaning and shortened cleaning time can be realized. In the first aspect of the invention, the outlets may be formed as a straight-slit pattern along the longitudinal direction of the plasma-generating zone. Alternatively, a plurality of outlets may be arranged in line along the longitudinal direction. The jetting outlets may be of any cross-sectional shapes such as circle, rectangle, slit-like, or polygon. Through appropriately selecting the cross-sections of outlets and the overall length of the arranged outlets, irradiation with plasma can be confined to a limited area. Through appropriately selecting the distance between the plasma-generating zone and each outlet, electrons are captured, and a plasma having high radical density can be jetted through the jetting outlets. As a result, accumulation of electric charges on the treatment object can be prevented, whereby precision of plasma treatment is enhanced. Also preferred is cooling of the plasma-generating gas supplied to the plasma generator of the invention. Through cooling, elevation of the plasma temperature to a level higher than the required level can be prevented, and impairment of products such as liquid crystal displays; e.g., damage to polarized film, can be prevented.

According to the present invention, a very small-scale plasma generator can be realized, and the gas supply direction, the plasma jetting direction, the shape of the jetted plasma, etc. may be designed as described. Thus, in one possible mode, a plurality of plasma jetting outlets are provided, and a gas is supplied to respective outlets in any desired directions. Therefore, irradiation with high-density plasma can be confined to an ACF-attached substrate portion, and the present cleaning device can be effectively installed in a very narrow space of a liquid crystal display fabrication apparatus.

Throughout the above-described aspects of the invention, plasma generation is preferably performed under atmospheric pressure. However, reduced or increased pressure may be employed. The term "atmospheric pressure" herein encompasses about 0.5 to about 2 atm.

Embodiment 1

FIG. 1.A is a cross-section of a plasma generator 100 according to one embodiment of the present invention, and FIG. 1.B shows the detailed shapes of electrodes 2a, 2b of the plasma generator 100 shown in FIG. 1.A.

The plasma generator 100 shown in FIG. 1.A has a cylindrical casing 10 made of a sintered ceramic produced from alumina ($Al_2O_3$) as a raw material. The openings at the ends of the casing are a gas inlet 10i and a gas outlet 10o, respectively. An electrode 2a is disposed in the vicinity of the gas inlet 10i provided inside the casing 10, and an electrode 2b is disposed in the vicinity of the gas outlet inlet 10o provided inside the casing 10. As shown in FIG. 1.B, each of the surfaces of the electrodes 2a, 2b facing each other has a plurality of recesses (hollow portions) H having a depth of about 0.5 mm. The casing 10 is a hollow cylinder having an inner diameter of 2 to 5 mm, a thickness of 0.2 to 0.3 mm, and a length of 25 cm, and the cross-section of each of the electrodes 2a, 2b normal to the longitudinal direction of the casing 10 has a diameter of about 1 mm. The power sources employed in Embodiment 1 supplies about 9 kV, which is obtained by boosting a commercial AC voltage of 100 V (60 Hz), and a voltage of 90 kV is applied to the electrodes 2a, 2b. The current flowing between the electrodes 2a and 2b is 20 mA. When argon gas is supplied through the gas inlet 10i, a plasma (hatched area denoted by P in FIG. 1.A) was generated, even when the electrodes 2a, 2b were separated at a maximum spacing of 24 cm along the longitudinal direction of the casing 10.

Then, through varying the inner diameter of the cylindrical casing 10 while the distance between the electrodes 2a and 2b was fixed to 24 cm, stable electric discharge was observed when the inner diameter was 3 mm or less. When the distance between the electrodes 2a and 2b was varied while the inner diameter of the cylindrical casing 10 is fixed to 3 mm, stable electric discharge was observed when the distance was 24 cm or shorter.

In the plasma generator 100 shown in FIG. 1.A, when oxygen ($O_2$) is supplied to generate oxygen plasma, a substance such as soot can be decomposed. In other words, the plasma generator 100 can be employed for cleaning an exhaust gas from diesel engines. Specifically, in the plasma generator 100 shown in FIG. 1.A, when oxygen ($O_2$) and non-treated exhaust gas (S) are fed through the gas inlet 10i, and an AC voltage is applied to the electrodes 2a, 2b, a treated exhaust gas (S') containing oxygen ($O_2$), carbon dioxide ($CO_2$), and water ($H_2O$) can be provided through the gas outlet 10o.

Embodiment 2

FIG. 2.A is a cross-section of a plasma generator 110 according to another embodiment of the present invention, and FIG. 2.B is a cross-section (partial view) of a plasma-generating zone P of the plasma generator 110 shown in FIG. 2.A normal to the longitudinal direction.

The plasma generator 110 shown in FIG. 2.A has a casing 11 made of a sintered ceramic produced from alumina ($Al_2O_3$) as a raw material. The casing 11 is in the form of rectangular parallelpiped. As shown in FIG. 2.A, the upper section of the casing 11 is provided with a slit-like gas inlet 11i extending in the longitudinal direction of the plasma-generating zone P. In the lower section of the casing 11, a plurality of outlets 11o through which plasma is jetted along the gas flow direction are disposed in the longitudinal direction of the casing 11. The cross-section of each of the gas outlets 11o normal to the gas flow direction is a circle having an inner diameter of 1 to 2 mm. Thus, the jetting outlets 11o for jetting the plasma to the outside correspond to portions extending from the plasma-generating zone P to the ends of the outlets, and are formed of a plurality of hollow cylinders.

Extending from the gas inlet 11i to the top of the plasma-generating zone P, a slit-like gas conduit 13 is formed. The gas conduit 13 has a width normal to the gas flow direction and to the longitudinal direction of the plasma-generating zone P (the front-to-back direction with respect to the sheet of FIG. 2.A, and the left-to right direction in FIG. 2.B) is 1 mm. The cylindrical gas outlets 11o each having an inner diameter of 1 to 2 mm are formed in a straight line along the longitudinal direction of the plasma-generating zone P.

The plasma-generating zone P is a rectangular parallelpiped internal space provided in the casing 11, and electrodes 2a, 2b are provided at respective ends of the rectangular parallelpiped. The plasma-generating zone P has a square cross-section normal to the longitudinal direction having a side of 2 to 5 mm and has a total length of 4 cm. Alternatively, the plasma-generating zone P may have a rectangular cross-section having a width normal to the gas flow and to the longitudinal direction of the plasma-generating zone P of 2 to 5 mm.

The electrodes 2a, 2b employed in Embodiment 2 had the same shapes as employed in Embodiment 1. An elevated voltage of about 9 kV obtained from a commercial AC voltage (60 Hz, 100 V) and a current of 20 mA were employed as a power source. This voltage was applied to the electrodes 2*a*, 2*b*, to thereby supply a current of 20 mA to the electrodes 2*a*, 2*b*. When argon gas was supplied through the gas inlet 11*i*, stable linear electric discharge was observed between the electrodes 2*a* and 2*b*, whereby plasma generation was confirmed. Even when the electrodes 2*a*, 2*b* were separated at a spacing of 4 cm, stable linear electric discharge was observed.

The plasma generator 110 can enhance adhesion between the glass substrate of a liquid-crystal display and anisotropic conductive film (ACF), in the case where an area of the glass substrate to which ACF is attached is washed before attachment of ACF to the substrate.

Then, through varying the length of the side of the cross-section normal to the longitudinal direction of the plasma-generating zone P while the distance between the electrodes 2*a* and 2*b* was fixed to 4 cm, stable linear electric discharge was generated when the side length was 5 mm or less. When the distance between the electrodes 2*a* and 2*b* was varied while the length of the side of the cross-section of the plasma-generating zone P was fixed to 5 mm, stable linear electric discharge was generated when the distance was 4 cm or shorter.

In Embodiment 2, stable linear electric discharge can be realized between the electrodes 2*a* and 2*b*. Through supplying a gas in a direction normal to the linear electric discharge, a generated linear plasma can be continuously supplied as a plate-like laminar flow. Thus, linear plasma can be continuously supplied through a plurality of lines of the jetting outlets 11*o* provided along the longitudinal direction of the plasma-generating zone P. Through moving the plasma generator relative to a treatment object in a direction normal to the gas flow direction and to the longitudinal direction, the treatment object can be plasma-treated over a wide area.

Each jetting outlet 11*o* may have a cross-section normal to the gas flow direction in any form such as circle, slit-like, rectangle, polygon, or ellipse. The jetting outlets may have a form of single-slit extending along the longitudinal direction of the plasma-generating zone P. The distance between the plasma-generating zone P and each gas-jetting outlet; i.e., the path of jetting outlet 11*o*, may be adjusted to a length required for capturing electrons on the wall of each jetting outlet 11*o*. Through controlling the distance in such a manner, irradiation of the treatment object with electrons can be prevented.

The invention claimed is:

1. An atmospheric plasma generator, comprising:
   a casing comprising an insulator;
   a longitudinal columnar plasma-generating zone which is defined by the casing;
   a first electrode and a second electrode which are separately disposed at both ends along a longitudinal axis of the longitudinal columnar plasma-generating zone and a surface of the first electrode faces a surface of the second electrode in a longitudinal direction of the longitudinal columnar plasma-generating zone, a distance between the first electrode and the second electrode defining a longitudinal length of the longitudinal columnar plasma-generating zone;
   a plasma-generating gas inlet for supplying a plasma-generating gas to the longitudinal columnar plasma-generating zone in a first direction normal to the longitudinal direction of the longitudinal columnar plasma-generating zone; and
   at least one outlet for jetting a gas comprising at least a plasma in the first direction normal to the longitudinal direction of the longitudinal columnar plasma-generating zone, in which the at least one outlet is provided along the longitudinal direction of the longitudinal columnar plasma-generating zone,
   wherein the longitudinal columnar plasma-generating zone comprises one continuous space in an atmospheric pressure between the surface of the first electrode and the surface of the second electrode,
   wherein the longitudinal length of the longitudinal columnar plasma-generating zone, in the longitudinal direction, is more than a width, which is perpendicular to the longitudinal direction and to the first direction, of the longitudinal columnar plasma-generating zone, and
   wherein the surface of the first electrode and the surface of the second electrode are exposed to, and in contact with, the plasma-generating gas, and a linear electric discharge is generated between the surface of the first electrode and the surface of the second electrode.

2. The atmospheric plasma generator according to claim 1, wherein the outlet comprises a plurality of jetting outlets which are provided along the longitudinal direction of the longitudinal columnar plasma-generating zone, each outlet comprising a cylindrical hole.

3. The atmospheric plasma generator according to claim 1, wherein the longitudinal columnar plasma-generating zone has the longitudinal length of 1 cm to 50 cm and a cross-sectional area of 3 mm$^2$ to 25 mm$^2$ in a direction normal to the longitudinal direction of the longitudinal columnar plasma-generating zone.

4. The atmospheric plasma generator according to claim 2, wherein the longitudinal columnar plasma-generating zone has the longitudinal length of 1 cm to 50 cm and a cross-sectional area of 3 mm$^2$ to 25 mm$^2$ in a direction normal to the longitudinal direction of the longitudinal columnar plasma-generating zone.

5. The atmospheric plasma generator according to claim 1, wherein the longitudinal columnar plasma-generating zone has the width, normal to the longitudinal direction of the longitudinal columnar plasma-generating zone and to the first direction of a gas flow direction, of 2 mm to 5 mm.

6. The atmospheric plasma generator according to claim 2, wherein the longitudinal columnar plasma-generating zone has the width, normal to the longitudinal direction of the longitudinal columnar plasma-generating zone and to the first direction of a gas flow direction, of 2 mm to 5 mm.

7. The atmospheric plasma generator according to claim 3, wherein the longitudinal columnar plasma-generating zone has the width, normal to the longitudinal direction of the longitudinal columnar plasma-generating zone and to the first direction of a gas flow direction, of 2 mm to 5 mm.

8. The atmospheric plasma generator according to claim 1, wherein the inside of the casing is not subjected to a substantial pressure elevation or reduction so as to serve as an atmospheric plasma source.

9. The atmospheric plasma generator according to claim 7, wherein the first electrode and the second electrode are disposed with a spacing of 1 cm to 50 cm.

10. The atmospheric plasma generator according to claim 1, wherein at least one electrode of the first electrode and the second electrode is provided with hollow portions on a surface thereof which face another electrode.

11. The atmospheric plasma generator according to claim 1, wherein the longitudinal length, as L (cm), of the longitudinal columnar plasma-generating zone and a cross-sectional area $\sigma$ (mm$^2$) normal to the longitudinal direction of the longitudinal columnar plasma-generating zone satisfy following relationships: $2 \leq L\sigma \leq 200$ and $3 \leq \sigma \leq 25$.

12. The atmospheric plasma generator according to claim 2, wherein the longitudinal length, as L (cm), of the longitudinal columnar plasma-generating zone and a cross-sectional area σ (mm²) normal to the longitudinal direction of the longitudinal columnar plasma-generating zone satisfy following relationships: 2≤Lσ≤200 and 3≤σ≤25.

13. The atmospheric plasma generator according to claim 3, wherein the longitudinal length, as L (cm), of the longitudinal columnar plasma-generating zone and a cross-sectional area σ (mm²) normal to the longitudinal direction of the longitudinal columnar plasma-generating zone satisfy following relationships: 2≤Lσ≤200 and 3≤σ≤25.

14. The atmospheric plasma generator according to claim 10, wherein the longitudinal length, as L (cm), of the longitudinal columnar plasma-generating zone and a cross-sectional area σ (mm²) normal to the longitudinal direction of the longitudinal columnar plasma-generating zone satisfy following relationships: 2≤Lσ≤200 and 3≤σ≤25.

15. The atmospheric plasma generator according to claim 1, wherein a voltage is applied in a direction normal to a flow of the plasma-generating gas.

16. The atmospheric plasma generator according to claim 1, wherein a voltage is applied in a longitudinal direction of the continuous space.

17. The atmospheric plasma generator according to claim 1, wherein the plasma-generating gas is supplied in a direction normal to the linear electric discharge to generate a planar plasma.

18. The atmospheric plasma generator according to claim 2, wherein path lengths of the jetting outlets include lengths required for capturing electrons on a wall of each of the jetting outlets.

19. The atmospheric plasma generator according to claim 1, wherein the linear electric discharge is generated in the longitudinal direction of the longitudinal columnar plasma-generating zone.

20. The atmospheric plasma generator according to claim 1, wherein the surface of the first electrode and the surface of the second electrode provide electric discharge starting areas of the linear electric discharge.

* * * * *